United States Patent
Leusink et al.

(10) Patent No.: US 6,274,496 B1
(45) Date of Patent: Aug. 14, 2001

(54) METHOD FOR SINGLE CHAMBER PROCESSING OF PECVD-TI AND CVD-TIN FILMS FOR INTEGRATED CONTACT/ BARRIER APPLICATIONS IN IC MANUFACTURING

(75) Inventors: Gerrit J. Leusink, Tempe; Michael G. Ward, Phoenix, both of AZ (US); Michael S. Ameen, Newburyport, MA (US); Joseph T. Hillman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/553,833

(22) Filed: Apr. 21, 2000

Related U.S. Application Data

(63) Continuation-in-part of application No. 09/294,487, filed on Apr. 20, 1999, now abandoned.

(51) Int. Cl.[7] .................................................. H01L 21/4763
(52) U.S. Cl. ........................ 438/685; 438/627; 438/643; 438/648; 438/656
(58) Field of Search .................................... 438/656, 685, 438/627, 628, 629, 630, 642, 643, 644, 648, 649, 680

(56) References Cited

U.S. PATENT DOCUMENTS

| | | |
|---|---|---|
| 3,656,995 | 4/1972 | Reedy, Jr. . |
| 4,749,589 | 6/1988 | Heinecke et al. . |
| 5,296,404 | 3/1994 | Akahori et al. . |
| 5,416,045 | 5/1995 | Kauffman et al. . |
| 5,593,511 | 1/1997 | Foster et al. . |
| 5,926,737 | 7/1999 | Ameen et al. . |
| 6,225,213 | * 5/2001 | Urabe .................................. 438/627 |

FOREIGN PATENT DOCUMENTS

| | | |
|---|---|---|
| 6-349774 | 12/1994 | (JP) . |
| WO 95/33865 | 12/1995 | (WO) . |
| WO 96/12048 | 4/1996 | (WO) . |

OTHER PUBLICATIONS

Ohto et al., A Novel TiN/Ti Contact Plug Technology for Gigabit Scale DRAM using Ti–PECVD and TiN–LPCVD, International Electron Devices Meeting (IEDM), U.S., New York, IEEE, Dec. 8, 1996, (Dec. 2, 1996) pp. 361–364.

* cited by examiner

Primary Examiner—Chandra Chaudhari
Assistant Examiner—Eric Kielin
(74) Attorney, Agent, or Firm—Wood, Herron & Evans, LLP

(57) ABSTRACT

A single chamber method for depositing a stack including titanium and titanium nitride on a wafer surface. Titanium is deposited by plasma enhanced chemical vapor deposition and then plasma nitrided. Titanium nitride is subsequently deposited by a thermal chemical vapor deposition process. Advantageously, the temperatures of the substrate and showerhead as well as the internal chamber pressure are maintained at substantially constant values throughout deposition of the stack.

36 Claims, 1 Drawing Sheet

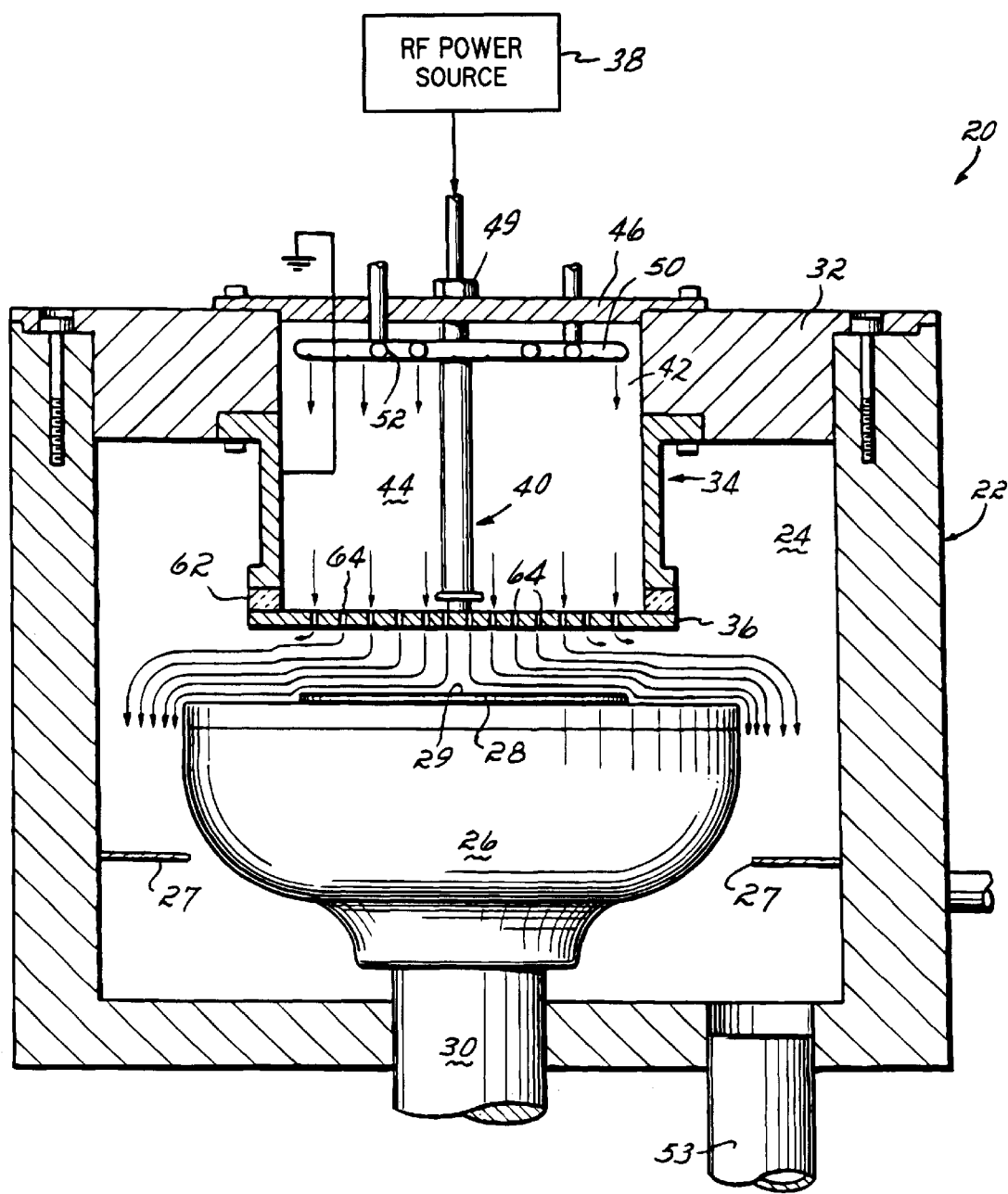

METHOD FOR SINGLE CHAMBER PROCESSING OF PECVD-TI AND CVD-TIN FILMS FOR INTEGRATED CONTACT/BARRIER APPLICATIONS IN IC MANUFACTURING

This application is a continuation-in-part of U.S. patent application Ser. No. 09/294,487, filed Apr. 20, 1999 now abn, hereby expressly incorporated by reference herein.

FIELD OF THE INVENTION

This invention relates generally to chemical vapor deposition (CVD) for applying film coatings to substrates, and more specifically to CVD for applying barrier layer stacks, of for example titanium and titanium nitride, to semiconductor wafer substrates.

BACKGROUND OF THE INVENTION

In the formation of integrated circuits (IC's), thin films containing metal elements are often deposited upon the surface of a substrate, such as a semiconductor wafer. Thin films are deposited to provide conducting and ohmic contacts in the circuits and between the various devices of an IC. For example, a desired thin film might be applied to the exposed surface of a contact or via hole on a semiconductor wafer, with the film passing through the insulative layers on the wafer to provide plugs of conductive material for the purpose of making interconnections across the insulating layers.

One well known process for depositing thin metal films is chemical vapor deposition (CVD) in which a thin film is deposited using chemical reactions between various deposition or reactant gases at the surface of the substrate. In CVD, reactant gases are pumped into proximity with a substrate inside a reaction chamber, and the gases subsequently react at the substrate surface resulting in one or more reaction by-products which form a film on the substrate surface. Any by-products remaining after the deposition are removed from the chamber. While CVD is a useful technique for depositing films, many of the traditional CVD processes are basically thermal processes and require temperatures in excess of 500 or 1000° C. in order to obtain the necessary reactions. Such a deposition temperature is often far too high to be practically useful in IC fabrication due to the effects that high temperatures have on various other aspects and layers of the electrical devices making up the IC. For this reason, one approach which has been utilized in CVD processes to lower the reaction temperature is to ionize one or more of the reactant gases. Such a technique is generally referred to as plasma enhanced chemical vapor deposition (PECVD). An efficient PECVD method has been set forth in commonly assigned U.S. Pat. No. 5,975,912 entitled "Low Temperature Plasma-Enhanced Formation of Integrated Circuits", expressly incorporated by reference herein in its entirety. The '912 patent discloses a method for single-chamber processing of low temperature (<500° C.) PECVD-Ti and TiN films for via applications. U.S. Pat. Nos. 5,567,243 and 5,716,870, each incorporated by reference herein in their entirety, describe hardware design and method for deposition of PECVD-Ti films.

In many applications, a titanium nitride barrier layer is required prior to deposition of certain metal conductors such as aluminum or tungsten. Titanium nitride can be deposited by chemical vapor deposition. The reactants and byproducts of the chemical vapor deposition—in particular, titanium tetrachloride—act to etch the titanium contact layer. Therefore, the titanium must be nitrided prior to titanium nitride chemical vapor deposition. A stack is thus created that includes a titanium film, a nitrided layer of the titanium film and an overlying titanium nitride layer, all between the underlying substrate or conductor and the metal of an overlying layer.

Customary methods of applying and nitriding titanium have been by PECVD. Deposition of titanium nitride has been customarily by thermal CVD. These PECVD and thermal CVD reactions have involved different process parameters, which have called for different processing equipment. As a result, the typical Ti, nitrided Ti and TiN stack production process sequence is performed in two separate modules, often both connected to a common vacuum transfer module of a semiconductor wafer processing cluster tool. The process sequence includes a substantial amount of overhead time for transferring each of the wafers first into a PECVD module and establishing stable process conditions in the module for Ti-PECVD, then after Ti deposition and nitriding of the deposited Ti layer, pumping the module and transferring the wafer through the transfer module to the thermal CVD module for deposition of the TiN layer including establishing stable process conditions in the module for the thermal CVD-TiN deposition, then the removal of the wafer from the thermal CVD-TiN module.

Differing process parameters have prevented integration of PECVD-Ti and thermal CVD-TiN processes in the same module. Traditionally, showerhead temperature for PECVD-Ti are at least 425° C., because lower temperature will form a $TiCl_xH_y$ film which will readily peel off of the showerhead, but not more than 500° C., because higher temperatures will result in chlorine corrosion of metal showerheads that are preferred for plasma generation, temperature control and other reasons in the PECVD reactor. On the other hand, in the thermal CVD reactors used for TiN deposition, showerhead temperature is usually at least 150° C., since lower temperature will cause $NH_4Cl$ condensation, and not more than 250° C., since higher temperature will produce TiN deposition on the showerhead. Wafer temperatures and chamber pressures are also commonly different for the PECVD-Ti and thermal-CVD reactions. Cycling of temperatures and pressures causes excessive flaking of deposits from reactor components, requiring frequent in-situ and ex-situ cleaning, all of which decreases productivity and increases overhead time, particularly stabilization time to recover from process parameter changes.

Depositions of Ti and TiN in the same reactor have been proposed by using PECVD processes for the TiN deposition as well as the Ti deposition, but TiN film properties and deposition efficiency that are produced with thermal CVD of TiN have had advantages which are preferred.

Accordingly, there is a need for a more efficient and effective method of depositing stacks of Ti, nitrided Ti and TiN, and particularly using PECVD-Ti and thermal CVD-TiN processes.

SUMMARY OF THE INVENTION

The present invention provides a CVD process for successively depositing titanium and titanium nitride in a single chamber, in particular with the Ti being deposited by PECVD, followed by nitriding, and the TiN being deposited by thermal CVD. To this end, and in accordance with the principles of the present invention, a titanium film is deposited onto a substrate surface in a reaction chamber by forming a plasma of titanium tetrahalide gas and hydrogen gas in proximity to the substrate surface, followed by nitriding the deposited titanium film within the chamber by a plasma of a nitrogen containing gas such as ammonia gas, nitrogen gas or an ammonia/nitrogen gas mixture, then by depositing, in the same chamber, a titanium nitride film over the nitrided titanium film by thermal CVD.

In accordance with the preferred embodiment of the invention, the temperature of the substrate, the temperature of the showerhead and the internal pressure of the chamber are maintained substantially constant throughout the Ti deposition, Ti nitriding and TiN deposition processes, which reduces the likelihood of flaking and particle generation and reduces overhead from process parameter changes. The single chamber process of the present invention increases throughput by integrating the TiN deposition with the underlying titanium deposition and nitriding processes.

In certain preferred embodiments of the invention, the substrate temperature is preferably maintained throughout the process above the minimum temperature for titanium to react with silicon in the same chamber and below the maximum temperature for which the titanium tetrachloride will etch the silicon. For example, the substrate temperature is preferably maintained throughout the process at a temperature of at least about 500° C., not higher than about 700° C. More preferably, the substrate temperature is selected to provide optimal margins at least about 580° C. The showerhead temperature is preferably maintained at a temperature of at least about 425° C. to prevent flaking of unstable titanium compounds from the showerhead and not more than the maximum process temperature of about 700° C. throughout the process. More preferably, for metal showerheads, the showerhead temperature is maintained at a temperature not more than about 500° C., to avoid corrosion of the metal. The internal chamber pressure is preferably maintained at about 1 torr to about 10 torr throughout the process. There is thus provided an integrated titanium and titanium nitride deposition process performed within a single reaction chamber.

BRIEF DESCRIPTION OF THE DRAWINGS

The FIGURE is a side view in partial cross-section of a deposition chamber for use in the present invention. Modification of this apparatus is disclosed in U.S. Pat. No. 5,628,829, which is expressly in rated by reference herein in its entirety.

DETAILED DESCRIPTION OF THE INVENTION

An efficient PECVD method has been set forth in commonly assigned U.S. Pat. No. 5,975,912 entitled "Low Temperature Plasma-Enhanced Formation of Integrated Circuits", expressly incorporated by reference herein in its entirety. The '912 patent discloses a method for single-chamber processing of low temperature (<500° C.) PECVD-Ti and TiN films for via applications. U.S. Pat. Nos. 5,567,243 and 5,716,870, each incorporated by reference herein in their entirety, describe hardware design and method for deposition of PECVD-Ti films. Commonly assigned and copending U.S. patent application Ser. No. 09/063,196 entitled "Method of Passivating And Conditioning Ti-PECVD Process Chamber And Method of Processing Therewith", expressly incorporated by reference herein in its entirety, discloses process flow parameters for a production worthy/stable PECVD-Ti process in a PECVD-Ti module. Commonly assigned and copending U.S. patent application Ser. No. 08/914,673 entitled "Use of TiCl$_4$ Etch Back Process During Integrated CVD-Ti/TiN Wafer Processing", expressly incorporated by reference herein in its entirety, discloses a method that etches titanium films off oxide surfaces prior to CVD-TiN deposition. This method eliminates such issues as corrosion of the titanium film by high partial pressures of TiCl$_4$ during subsequent CVD-TiN processes. U.S. Pat. Nos. 5,279,857 and 5,308,655, both incorporated by reference herein in their entirety, disclose methods for reduction of CVD-TiN film resistivity by means of an ammonia anneal. In commonly assigned and copending U.S. patent application Ser. No. 08/940,779 entitled "Apparatus and Method for Preventing the Premature Mixture of Reactant Gases in CVD and PECVD Reactions", expressly incorporated by reference herein in its entirety, the showerhead design is disclosed that allows for non-mixed introduction of two reactant gases into a CVD chamber. In commonly assigned and copending U.S. patent application Ser. No. 09/153,128 entitled "Apparatus for Electrically Isolating an Electrode in a PECVD Process Chamber", expressly incorporated by reference herein in its entirety, a design is disclosed that prevents the formation of an electrical conducting path on insulators that are located between RF powered surfaces and grounded surfaces. U.S. Pat. No. 5,593,511, expressly incorporated by reference herein in its entirety, discloses low temperature nitridation of a titanium layer.

The FIGURE shows one embodiment of a CVD reactor for use in the present invention. A similar structure is disclosed in U.S. Pat. No. 5,647,911, the disclosure of which is expressly incorporated herein by reference in its entirety. Reactor 20 includes a deposition chamber housing 22 which defines a reaction or deposition space 24. Reactor 20, and specifically reaction space 24 within housing 22, may be selectively evacuated to various different internal pressures. For Ti and TiN CVD reactions, these pressures are typically in the 0.2 to 20 Torr range. The susceptor 26 for holding a substrate 28 is coupled to a shaft 30. Susceptor 26 is also heated by a heating element (not shown) in order that susceptor 26 may heat substrate 28 supported thereon to a controlled temperature required for the process being performed. Usually this temperature is at least about 500° C., and for the processes described herein is preferably in the range of from about 580° C. to about 700° C.

Extending downwardly from a top wall 32 of housing 22 is a cylinder assembly 34 which is attached to a gas-dispersing showerhead 36. Showerhead 36 is suspended above substrate 28 by assembly 34. The cylinder assembly 34, in combination with an opening 42 formed in the top housing wall 32, forms a generally vertical flow passage 44 which extends between a housing cover 46 and showerhead 36. The showerhead 36 is preferably a post-mix type showerhead of the type described in U.S. patent application Ser. No. 08/940,779, filed Sep. 30, 1997 and entitled "Apparatus and Method for Preventing the Premature Mixture of Reactant Gases in CVD and PECVD Reactions", hereby expressly incorporated by reference herein. Showerhead 36 is coupled to an RF power source 38 by an appropriate RF feedline assembly 40 which extends through cover 46. A sealing structure 49 seals the opening around feedline assembly 40. Feedline 40 can include a heat pipe (not shown) to dissipate unwanted heat. The showerhead thus may be used as an electrode and gas introduction element for plasma enhanced CVD, for example for the deposition and nitriding of titanium, or as a gas distribution showerhead for deposition of titanium nitride.

The showerhead 36 is biased with RF energy to function as an RF electrode for PECVD techniques. The close spacing of the RF electrode and the resulting concentrated plasma is very useful for PECVD, and particularly for PECVD of titanium-containing films. The RF power source 38, through RF feedline assembly 40 biases the showerhead 36 so that the showerhead functions as the RF electrode. The grounded susceptor 26 may thus form another parallel electrode. An RF field is created preferably between showerhead 36 and susceptor 26. The RF field created by the biased showerhead 36 excites the plasma gases which are dispensed through holes 64 so that a plasma is created immediately below showerhead 36 rather than within the flow space 44 above the showerhead/electrode. Insulator sleeves may be utilized within the RF feedline assembly 40 to insulate the RF line from the metal of cylinder assembly 34 and housing 22 and quartz insulator ring 62 may be used to separate the showerhead 36 from cylinder assembly 34. The rotation of susceptor 26 may be used to ensure uniform flow of gas to the plasma for a uniform deposition.

The reactant gases, such as $TiCl_4$ are introduced through rings 50 and 52. The gas flow from rings 50 and 52 develops within the length of the flow space 44 as the gas travels to the showerhead 36. The gas particles of the reactant gas are excited by the RF field generated by showerhead 36 and susceptor 26. Therefore, a gas mixture of excited reactant gas particles and radicals and ions of the plasma gases are concentrated above substrate 28 and close to the substrate. The cylinder assembly 34 is dimensioned such that the spacing between showerhead 36 and substrate 28 is preferably under 25 mm, and more preferably approximately 20 millimeters.

The frequency range of between, for example, 450 KHz and 13.56 MHZ, for the RF energy applied to the showerhead 36 for PECVD is found to be suitable, though the PECVD-Ti reaction and nitridizing reaction are not particularly frequency sensitive. The use of the showerhead 36 in close proximity to substrate 28 produces a concentrated plasma with a large density of useful gas radicals and ions proximate the substrate surface 29.

Waste gases are removed from reaction space 24 through port 53. Baffling 27 may be provided to even the gas flow around the susceptor 26.

This reactor 20 is useful in plasma-enhanced chemical vapor deposition of titanium, titanium nitride, titanium silicide, and is useful for the annealing of a previously-deposited titanium film to form titanium nitride. Using the above-described reactor 20 and the process conditions described below, titanium deposition, nitridation and titanium nitride deposition may all be performed successively within the single chamber of reactor 20.

The substrate 28 can be any typical IC substrate including silicon or silicon dioxide, as well as such substrates coated or partially coated with metal conductors, contacts, insulating layers and the like. Certain aspects of the invention are particularly useful for depositions onto silicon.

To deposit a titanium film, a titanium halide gas, such as titanium tetrachloride, is added with hydrogen. In this reaction, the flow rate of titanium tetrachloride should be about 2 to about 100 sccm (generally about 5 sccm) with a significant excess flow of hydrogen gas. Generally, the hydrogen gas flow rate will be 10 to about 500 times that of the flow rate of titanium tetrachloride, for example, about 300 times. Argon can also be used and the hydrogen gas partially released accordingly. The gas inlet temperature or showerhead temperature for these combined gases is established at about 425° C. to about 500° C. with the substrate heated to a temperature that is between at least about 500° C. and about 700° C., and most preferably about 580° C. The pressure of the reaction chamber can be from about 0.2 torr to about 20 torr, generally about 1.0 torr to about 10 torr. At pressures higher than 20 torr, a plasma will not likely form.

The RF electrode is operated at between about 100 watts up to, as a maximum power, the power at which the devices are damaged, which would be about 5 kilowatts. However, for practical purposes, about 350 watts is sufficient. The frequency of the RF electrode is set at from about 33 MHZ down to about 55 KHz, with about 450 KHz being acceptable. This frequency is a frequency established by the Federal Communication Commission and therefore most equipment is set up for this frequency. However, it is certainly not determined for the optimization of the present reaction.

Thus, the combined titanium halide and hydrogen gases are injected into cylinder assembly 34 and pass through RF electrode/showerhead 36. A plasma is created and the titanium is formed and deposits onto the substrate 28. The hydrogen reacts with the halide, i.e., chloride, to form hydrogen chloride, which is exhausted. The reaction is continued and the titanium film is deposited until a desired thickness of film is applied. Depending upon the particular application, this currently can vary from about 20 angstroms to about 2,000 angstroms, depending on the desired application.

A titanium silicide layer may optionally be formed on the substrate surface 29, such as within contact holes or vias. For the formation of titanium silicide, a titanium halide gas, preferably titanium tetrachloride, is reacted with silane to form titanium suicide and hydrogen chloride. An inert gas such as argon or helium may be introduced, as necessary to maintain pressure.

The titanium film deposited as described above is then nitrided within the same reactor 20. In this reaction, the deposited titanium film on the surface 29 of substrate 28 is exposed to a nitrogen-containing plasma, such as an ammonia and/or nitrogen plasma. Ammonia is preferred because of its better reactivity. The plasma is created by simply subjecting the nitriding gas to an RF electrode at elevate temperature and reduced pressure. The flow rate of the nitriding gas, preferably either ammonia or nitrogen gas, can be from about 10 sccm to about 5000 sccm. Preferably, the RF frequency will be about 580 KHz. The temperature of the reaction, i.e., the substrate temperature, is at least about 500° C., and preferably at least about 580° C. A preferred substrate temperature for nitridation is the same temperature used for depositing the titanium film, such that there is substantially no substrate temperature change between processes. The showerhead is preferably maintained at a temperature of about 425° C. to about 500° C. during titanium nitride deposition, and preferably is the same showerhead temperature as used for depositing the titanium film.

The internal pressure of the reactor chamber must remain subatmospheric during the nitridation, and generally can vary from about 0.2 torr up to about 20 torr, with about 1 to 10 torr being preferred. Preferably, the internal pressure of the reactor chamber during the nitriding of the titanium is the same as the pressure used for depositing the titanium film, such that there is no pressure change between processes. In the nitridation reaction, the reaction time can vary from about 1 second to about 100 seconds, with about 30–50 seconds being preferred.

Titanium nitride is deposited by thermal CVD on the nitrided deposited titanium film, such as by reacting titanium tetrachloride or other titanium halide with a source of nitrogen, such as ammonia gas or a combination of nitrogen and hydrogen gas, to produce titanium nitride and hydrogen chloride as a byproduct. The flow rate of titanium halide should preferably be from about 0.5 to about 50 sccm. The flow rate of nitrogen source gas should be from about 50 to about 5000 sccm. The reaction temperature, or substrate temperature, is at least about 580° C., and preferably is the same substrate temperature as used for depositing the titanium film and nitriding the titanium film, such that there is no substrate temperature change between processes. The showerhead is preferably maintained at a temperature of about 425° C. to about 500° C. during titanium nitride deposition, and preferably is the same showerhead temperature as used for depositing the titanium film and nitriding the titanium film. Unlike the use of the lower temperatures in conventional thermal CVD-TiN deposition processes which seeks to prevent TiN deposition on the showerhead, the higher temperatures allow TiN deposition on the showerhead and uses the TiN deposition to bring together the process conditions of the Ti, nitridizing and TiN depositions and to make the reactor more stable. Use of constant temperature avoids particle generation that occurs with temperature cycling. Showerhead temperatures of 580° C. or 590° C. can also be used, with showerhead temperatures up to 650° C. or even 700° C. also useable, with ceramic or other corrosion resistant coating of the showerhead employed to prevent corrosive reaction of the hot reactant gases with the showerhead.

During the thermal CVD of TiN, the internal pressure of the reactor chamber may be maintained at from about 0.2 torr up to about 20 torr, with about 1 to 10 torr being preferred. Preferably, the internal pressure of the reactor chamber is held constant at the same pressure used for depositing the titanium film and for nitriding the titanium film such that there is substantially no pressure change between processes.

Thus, according to the present invention, multiple layers are deposited onto a substrate within a single reaction chamber. A layer of titanium is deposited first onto the substrate, followed by an ammonia or nitrogen plasma anneal to nitridize the titanium. The titanium nitride layer is then deposited according to the procedure previously set forth. The substrate temperature, showerhead temperature and internal pressure are advantageously maintained at substantially steady values throughout. By avoiding changes in temperature and pressure between processes, the likelihood of flaking and particle generation is reduced. Avoiding parameter changes further facilitates single chamber use by eliminating pumping and purging time and other parameter change overhead, thus greatly increasing throughput, particularly by eliminating or reducing stabilization time due to process parameter changes. Also, by replacing two chambers with one, two one-chamber integrated Ti/TiN process modules can be used to process twice as many wafers by processing two wafers simultaneously in different chambers. This further increases throughput in addition to the throughput increase achieved by eliminating the overhead associated with performing processes successively in two chambers. The single chamber process of the present invention further allows for manufacturers to qualify a single set of parameters, which are then used throughout the process.

In an alternative embodiment of the present invention, an integrated contact metallization process is performed by first depositing titanium onto a silicon surface by PECVD, during which a layer of titanium silicide is formed between the silicon surface and the titanium film. After the titanium deposition, an ammonia or nitrogen plasma anneal is performed to provide an upper layer of nitrided silicide titanium. Finally, a titanium nitride layer is deposited by thermal CVD, again in the same reaction chamber.

After depositing titanium nitride over a nitrided titanium film or nitrided titanium silicide film, a low resistivity metal fill layer is deposited, such as copper, aluminum or tungsten. This final deposition, however, generally requires a separate chamber using sputter deposition technology. Any sputter deposition chamber typically employed may be used in this respect. The method of sputter deposition is well known to those skilled in the art.

In certain embodiments of the present invention, when depositing a titanium nitride film over a nitrided titanium film or nitrided silicide titanium film, the titanium nitride is deposited in two steps. In an initial step, the titanium is deposited under conditions of titanium tetrachloride depletion, for example, with titanium tetrachloride flow rate of about 8 sccm with a flow rate of ammonia of about 80 sccm with about 1 liter per minute of nitrogen as a diluent and at a pressure of about 1 torr. After a thin layer of, for example, about 50 to 500 Å, of titanium nitride has been deposited, the flow rate of the titanium tetrachloride is turned up into the saturation regime, for example, to about 30 sccm, with the ammonia and nitrogen rates preferably remaining approximately constant. The titanium nitride is deposited to a desired thickness.

During titanium deposition, nitridation and titanium nitride deposition, $TiN(Cl_x)$ films are deposited on hot internal chamber surfaces, such as on the showerhead, insulators, and on the susceptor surface outside the wafer area. With this integrated process in a single chamber using constant process parameters, it has been found that hundreds of wafers can be processed without the need to subject the reactor to cleaning. Periodically, after several hundred or a thousand or so wafers, an in situ cleaning of the reactor is employed and less frequently a wet cleaning may be employed. After a wet or in-situ cleaning of the process chamber, it is necessary to pre-coat the internal chamber surfaces prior to continued processing of production wafers. In prior methods in which two chambers were used, two different pre-coating processes were employed. In the titanium deposition chamber, the pre-coating process included PECVD of titanium followed by an ammonia anneal to coat the internal chamber surfaces with approximately 3800 Å of Ti(N). In the TiN deposition chamber, the pre-coating process consisted of CVD of TiN to coat the internal chamber surfaces with approximately 5000 Å of TiN. Because the two pre-coating processes result in basically the same film on the internal chamber surfaces, either pre-coating process may be used to pre-coat the internal chamber surfaces for the single chamber processing of the present invention. The pre-coating or conditioning of the chamber that is believed to be most preferred is that set forth in pending U.S. patent application serial no. 09/063,196, filed Apr. 20, 1998 and entitled "Method of Passivating and Stabilizing a Ti-PECVD Process Chamber and Combined Ti-PECVD/TiN-CVD Processing Method and Apparatus, hereby expressly incorporated by reference herein, followed by the thermal CVD titanium nitride pre-coating process.

While the preferred embodiments of the present invention include maintaining a constant substrate temperature, showerhead temperature and pressure throughout the single chamber Ti/TiN deposition for optimal process integration and reduced cleaning frequency, it is a feature of the present invention that a single chamber integrated Ti/TiN process is achieved by using PECVD of Ti, followed by plasma nitridation, then thermal CVD of TiN. In such a process, a lower showerhead temperature, on the order of about 150°

C. to about 250° C. may be used during thermal CVD of TiN, although more frequent cleaning of internal chamber surfaces will be necessitated, because film deposited by PECVD-Ti adheres poorly at low showerhead temperatures. It is thus advantageous to use the same higher showerhead temperature as used with PECVD of Ti to avoid frequent cleaning.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of depositing a stack that includes titanium and titanium nitride films on a wafer surface in a single chamber, comprising the steps of:
   placing a substrate having a wafer surface in a reaction chamber in spaced relation from a showerhead;
   depositing a titanium film onto the wafer surface in the chamber by forming within the chamber a first plasma of a gas mixture comprising a titanium halide and hydrogen;
   nitriding the deposited titanium film within the chamber by creating a second plasma of a gas selected from the group consisting of ammonia, nitrogen and a mixtures thereof; and
   depositing a titanium nitride film on the nitrided deposited titanium film in the chamber by a thermal CVD process using a gas mixture comprising a titanium halide and a nitrogen source gas.

2. The method of claim 1, wherein the step of depositing a titanium film is performed with the wafer surface at a temperature of at least about 500° C.

3. The method of claim 2, wherein the step of depositing a titanium film is performed with the wafer surface at a temperature from about 550° C. to about 700° C.

4. The method of claim 2, wherein the step of depositing a titanium film is performed with the wafer surface at a temperature of at least about 580° C.

5. The method of claim 1, wherein the step of nitriding the deposited titanium film is performed with the wafer surface at a temperature of at least about 500° C.

6. The method of claim 2, wherein the step of nitriding the deposited titanium film is performed with the wafer surface at the same temperature as in the step of depositing a titanium film.

7. The method of claim 6, wherein the step of depositing a titanium nitride film is performed with the wafer surface at the same temperature as in the steps of depositing a titanium film and nitriding the deposited titanium film.

8. The method of claim 1, wherein the step of depositing a titanium nitride film is performed with the wafer surface at a temperature of at least about 580° C.

9. The method of claim 1, wherein the steps of depositing a titanium film, nitriding the deposited titanium film and depositing a titanium nitride film are performed with the wafer surface at a substantially constant temperature of at least about 580° C.

10. The method of claim 1, wherein the chamber has an internal pressure of about 1 torr to about 10 torr during the step of depositing a titanium film.

11. The method of claim 1, wherein the chamber has an internal pressure of about 0.2 torr to about 20 torr during the step of depositing a titanium nitride film.

12. The method of claim 1, wherein the chamber has a substantially constant internal pressure of about 1 torr to about 10 torr during the steps of depositing a titanium film, nitriding the deposited titanium film and depositing a titanium nitride film.

13. The method of claim 12, wherein the constant internal temperature is about 5 torr.

14. The method of claim 1, wherein the step of depositing a titanium film is performed with a showerhead at a temperature of about 425° C. to about 700° C.

15. The method of claim 1, wherein the step of nitriding the deposited titanium film is performed with a showerhead at a temperature of about 425° C. to about 700° C.

16. The method of claim 1, wherein the step of depositing a titanium nitride film is performed with a showerhead at a temperature of about 425° C. to about 700° C.

17. The method of claim 1, wherein the steps of depositing a titanium film, nitriding the deposited titanium film and depositing a titanium nitride film are performed with the showerhead at a substantially constant temperature of between about 425° C. and about 700° C.

18. The method of claim 1, wherein the showerhead is metal and the steps of depositing a titanium film, nitriding the deposited titanium film and depositing a titanium nitride film are performed with the showerhead at a substantially constant temperature of between about 425° C. and about 500° C.

19. The method of claim 1 further comprising throughout the depositing of the titanium film, the nitriding of the deposited titanium film and the depositing of the titanium nitride film on the nitrided deposited titanium film in the chamber, maintaining the wafer surface at a substantially constant temperature, maintaining total gas pressure in the chamber at a substantially constant pressure, and maintaining showerhead temperature at a substantially constant temperature.

20. The method of claim 1 further comprising throughout the depositing of the titanium film, the nitriding of the deposited titanium film and the depositing of the titanium nitride film on the nitrided deposited titanium film in the chamber, maintaining the wafer surface at a substantially constant temperature of at least about 580° C., maintaining total gas pressure in the chamber at a substantially constant pressure between about 1 torr and about 10 torr, and maintaining showerhead temperature at a substantially constant temperature of between about 425° C. and about 500° C.

21. The method of claim 1 further comprising an initial step of pre-coating at least one of an internal chamber surface with TiN after cleaning the chamber surface.

22. The method of claim 1, wherein the step of depositing the titanium nitride film comprises a first thermal CVD deposition under conditions of titanium tetrachloride depletion to a first thickness of titanium nitride, and a second thermal CVD deposition under conditions of titanium tetrachloride saturation to a final thickness of titanium nitride.

23. The method of claim 1, wherein the wafer surface is silicon, and further comprising during the step of depositing the titanium film forming a layer of titanium suicide between the silicon wafer surface and the deposited titanium film.

24. The method of claim 1, wherein the first and second plasmas are created within 25 mm of the wafer surface.

25. The method of claim 1, wherein the steps of depositing a titanium film, nitriding the deposited titanium film and depositing a titanium nitride film are performed with the showerhead at a temperature of between about 150° C. to about 250° C.

26. The method of claim 1, wherein the titanium halide is titanium tetrachloride.

27. A method of depositing a stack that includes titanium and titanium nitride films onto a substrate surface in a single chamber comprising:

placing a substrate having a surface in a reaction chamber in spaced relation from a showerhead;

depositing a titanium film onto the surface in the chamber by plasma enhanced chemical vapor deposition; then nitriding the deposited titanium film in the chamber by forming a plasma of a gas selected from the group consisting of ammonia and nitrogen or a mixture of ammonia and nitrogen; then depositing a titanium nitride film on the nitrided deposited titanium film in the chamber by a thermal CVD process; and throughout the depositing of the titanium film, the nitriding of the deposited titanium film and the depositing of the titanium nitride film on the nitrided deposited titanium film in the chamber, maintaining the surface at a substantially constant temperature that is at least about 580° C., maintaining total gas pressure in the chamber at a substantially constant pressure that is between about 1 torr and about 10 torr, and maintaining showerhead temperature at a substantially constant temperature that is at least about 425° C.

28. The method of claim 27 wherein the showerhead is metal and its temperature is maintained at a substantially constant temperature that is between about 425° C. and about 500° C.

29. The method of claim 27, wherein the showerhead temperature is maintained at a substantially constant temperature that is between about 500° C. and about 700° C., and wherein the showerhead comprises a surface material that is resistant to corrosion at temperatures above about 500° C.

30. The method of claim 27 wherein the depositing of the titanium nitride film on the nitrided deposited titanium film in the chamber includes:

depositing titanium nitride by thermal CVD in an initial step in a titanium halide depletion regime with titanium halide flowing at a first flow rate in which titanium halide is diluted in a flow of gas that includes a nitrogen containing gas; and following deposition of titanium nitride by the initial step, increasing the flow rate of titanium halide to a flow rate in a saturation regime and thereby depositing titanium nitride in a second step over the titanium nitride deposited in the initial step.

31. The method of claim 27, wherein the depositing of the titanium nitride film on the nitrided deposited titanium film in the chamber includes:

depositing the titanium nitride film in an initial step in a titanium tetrachloride depletion CVD mode with titanium tetrachloride flowing at a flow rate of about 8 sccm, with ammonia flowing at a flow rate of about 80 sccm and with nitrogen flowing at a flow rate of about 1 liter per minute as a diluent at a pressure of about 5 torr to thereby form a layer of TiN about 100 to 500 angstroms thick; and then increasing the flow rate of titanium tetrachloride to a flow rate in a saturation regime of about 30 sccm with the flow rates of ammonia and of nitrogen remaining constant, thereby forming a further layer of TiN over the thin layer.

32. The method of claim 27 wherein the PECVD of Ti includes forming within the chamber a first plasma of a gas mixture comprising titanium halide and hydrogen, wherein the first plasma is created within 25 mm of the substrate surface.

33. The method of claim 27, wherein the plasma during nitriding is created within 25 mm of the deposited titanium film.

34. The method of claim 27, wherein the temperature of the substrate surface is not more than 700° C.

35. The method of claim 27 further comprising an initial step of pre-coating at least one of an internal chamber surface with TiN after cleaning the chamber surface.

36. The method of claim 27, wherein the substrate surface is silicon, and further comprising during the step of depositing the titanium film forming a layer of titanium silicide between the silicon substrate surface and the deposited titanium film.

* * * * *

UNITED STATES PATENT AND TRADEMARK OFFICE
CERTIFICATE OF CORRECTION

PATENT NO. : 6,274,496 B1
DATED : August 14, 2001
INVENTOR(S) : Leusink et al.

It is certified that error appears in the above-identified patent and that said Letters Patent is hereby corrected as shown below:

Title page,
The Title reads "PECVD-TI" and should read -- PECVD-Ti -- and "CVD-TIN" should read -- CVD-TiN --.

Column 3,
Line 44, reads "in rated" and should read -- incorporated --.

Column 6,
Line 31, reads "suicide" and should read -- silicide --.

Column 9,
Line 2, reads "TIN" and should read -- TiN --.

Column 10,
Line 59, reads "suicide" and should read -- silicide --.

Signed and Sealed this

Ninth Day of April, 2002

Attest:

Attesting Officer

JAMES E. ROGAN
Director of the United States Patent and Trademark Office